United States Patent [19]

Reddy et al.

[11] Patent Number: 5,535,172
[45] Date of Patent: Jul. 9, 1996

[54] DUAL-PORT RANDOM ACCESS MEMORY HAVING REDUCED ARCHITECTURE

[75] Inventors: Chitranjan N. Reddy, Milpitas; Kenneth A. Poteet, San Jose, both of Calif.

[73] Assignee: Alliance Semiconductor Corporation, San Jose, Calif.

[21] Appl. No.: 395,443

[22] Filed: Feb. 28, 1995

[51] Int. Cl.⁶ .................................................. G11C 7/00
[52] U.S. Cl. ............... 365/230.03; 365/51; 365/189.02; 365/189.05; 365/189.12; 365/230.02; 365/230.08; 365/240
[58] Field of Search .................. 365/230.03, 189.05, 365/230.08, 240, 189.02, 230.02, 51, 63, 189.12, 78

[56] References Cited

U.S. PATENT DOCUMENTS

| | | | |
|---|---|---|---|
| 4,281,401 | 7/1981 | Redwine et al. | 365/222 |
| 4,541,075 | 9/1985 | Dill et al. | 365/189 |
| 4,769,789 | 9/1988 | Noguchi et al. | 365/189 |
| 5,440,521 | 8/1995 | Tsumozaki et al. | 365/230.03 |
| 5,442,770 | 8/1995 | Barratt | 365/230.03 X |
| 5,473,566 | 12/1995 | Rao | 365/230.03 X |

Primary Examiner—Do Hyun Yoo
Attorney, Agent, or Firm—Bradley T. Sako

[57] ABSTRACT

A dual-port semiconductor memory device is disclosed that includes a number of array blocks (12) having memory cells disposed in rows and local columns, with each local column having a local bit line pair (30). A sense amplifier row (28) is associated with each array block (12) and includes a sense amplifier (28) coupled to each local bit line pair (30). Each sense amplifier row (14) is commonly connected through a number of bit line gates (32) to global bit line pairs (26) disposed on a higher fabrication layer than that of the local bit lines (30). A block decode signal commonly activates all the bit line gates (32) of one array block to couple the global bit lines (26) to one sense amplifier row (14). The global bit lines (26) are also connected to a column decoding section (18) which provides random input/output selection of a global bit line pair (26). A latch row (20) is also coupled to the global bit lines (26) through a number of latch gates (42). The latch gates (42) provide parallel input/output to the global bit line pairs (26). The latch row (20) is coupled to a serial shift register (22) for serial output of data stored within the latch row (20). In an alternate embodiment, there are one half the number of global bit line pairs (26) as there are local bit line pairs (30) in a given block array (12). Even and odd local bit line pairs (30) are multiplexed onto the global bit lines (26) by pairs of bit line gates (32). Correspondingly, the global bit lines (26) are multiplexed to even and odd latches (40) in the latch row (20).

16 Claims, 6 Drawing Sheets

DUAL-PORT RANDOM ACCESS MEMORY HAVING REDUCED ARCHITECTURE

TECHNICAL FIELD

The present invention relates generally to high density random access memory (RAM) semiconductor circuits, and more particularly to dual-port dynamic RAMs (DRAMs) having both a random input/output port and a serial input/output port.

BACKGROUND OF THE INVENTION

As the data processing speed of computer systems increases, the need for faster memory speeds also increases. Conventional (or single port) DRAMs, due to their high density and relatively low manufacturing cost, are presently used for the majority of memory applications. Conventional DRAMs, however, are not feasible for many growing memory applications. While cost effective, conventional DRAMs have a lower operating speed relative to other memory types.

Faster memory types include static random access memories (SRAMs) and dual-port DRAMs (called video RAMs, or VRAMs, in some instances). SRAMs have higher operating speeds, but have cells of a more complex design and larger size. Dual-port DRAMs provide speed advantages over conventional DRAMs by providing an additional input/output port to the memory array. In conventional DRAMs, read and write operations may never occur simultaneously, as both operations occur through a single random access port. In contrast, in a dual-port DRAM, the second port (most often a serial port) is provided in addition to the random access port. Data is read and written by transferring an entire array row at one time between a serial shift register and the array. The serial shift register receives and outputs the data in a serial manner.

U.S. Pat. No. 4,281,401 issued to Redwine et al., describes a semiconductor memory of open bit line architecture having a serial input/output design. The memory device includes an array having a serial shift register connected thereto. While providing a serial input and output, the invention of Redwine et al. is a one port design, providing access to the array on a row-by-row basis only.

U.S. Pat. No. 4,541,075 issued to Dill et al., describes a semiconductor memory having two input/output ports. The first port is a s random access port which allows a single bit to be read from, or written to the array. The second port is a row buffer serial register for allowing the reading or writing of an entire row. In a write operation for the second port, data are entered into the serial register in a serial fashion and written to a row in a single parallel write operation. In a read operation, an entire row is written in a parallel operation to the row buffer serial register, and the data is output in a serial fashion. The column decoders, sense amplifiers, and row buffer serial register are all disposed on one side of the array.

U.S. Pat. No. 4,769,789 issued to Noguchi et al., describes a semiconductor memory having an array that includes both random access and serial access to the memory cells within. In an open bit line embodiment of the invention, a row of sense amplifiers is centrally disposed within the array, a column decoder is disposed on one side of the array, while on the other side of the array are a first row a transfer gates, a row of latches, a row of serial gates, and a row of shift registers. In a random operation the column decoder activates gates surrounding the sense amplifier of a selected column. In serial operation the column decoder provides the first register from which serial data transfer is to begin. In a "folded" bit line embodiment of the '789 patent, a row of sense amplifiers, a row of gates and a column decoder are disposed on one side of the array while a row of transfer gates, latches, serial gates and a shift register are disposed on the opposite side of the array. One embodiment of Noguchi et al. increases the memory size using two identical arrays together.

In the prior art it is known to provide a dual-port DRAM composed of multiple arrays, each having a random access port and a serial access port. Referring now to FIG. 1, a dual-port DRAM of the prior art is shown having this configuration. The dual-port DRAM 1 has four arrays, labeled 2a–2d. Each array has an accompanying column decoder section 3a–3d, row decoder section 4a–4d, a row of sense amplifiers 5a–5d, and a serial output portion 6a–6d. Column decoders 3a and 3b, and the row of sense amplifiers 5a and 5b occupy the space between arrays 2a and 2b. Similarly, column decoders 3c and 3d and sense amplifier rows 5c and 5d are situated between arrays 2c and 2d.

A serial input/output section 6 is provided for each array 2. The serial input/output sections 6b–6c are situated between arrays 2b and 2c opposite from their respective column decoders (3b and 3c) and sense amplifier rows (5b and 5c). Serial output sections 6a and 6d are on the ends of the arrays. Each serial input/output section 6a–6d includes a latching serial shift register arrangement, as is well known in the art. The example set forth in FIG. 1 illustrates a "by four" (×4) dual-port DRAM arrangement. Random read or write operations to one bit on each array can occur simultaneously. At the same time, each array can provide a row read or write to its respective serial output portion 6a–6d. The serial output portions 6a–6d provide four serial output ports.

While a number of dual-port DRAM designs exist in the prior art, the designs are complex requiring a large amount of silicon space for the various device sections. Process improvements can provide smaller device geometries, but such improvement have limitations. Thus, it is always desirable to provide alternative designs that reduce the physical area of a memory device.

SUMMARY OF THE INVENTION

It is an object of the present invention to provide a dual-port DRAM of reduced physical area.

It is a further object of the present invention to provide a dual-port DRAM, having a number of array blocks, with a reduced number of column decoder sections.

According to the invention a dual-port DRAM includes a number of array blocks, each array block having an associated sense amplifier row. The array blocks are divided into rows and "local" columns, with each local column terminating in a single sense amplifier within its associated sense amplifier row. The local columns of the array blocks include bit lines fabricated with a first conductive layer. A single column decoder and a serial input/output portion are situated remote from the sense amplifiers. A second layer of interconnect, fabricated from a second conductive layer, extends above the array blocks and includes a number of "global" bit lines that connect the sense amplifiers to both the column decoder and the serial input/output portion. Sense amplifier rows are selectively coupled to the global bit lines according to row address. Once a sense amplifier row is coupled to the global bit lines, data can be read or written into the serial input/output portion in a row-by-row fashion, or the array block associated with the sense amplifier row can be read or written to in a random access manner.

According to an aspect of the invention there are fewer global bit lines than local bit lines, I and the sense amplifiers of multiple local columns are multiplexed to one global bit line. The global bit lines are multiplexed between multiple latches in a latch row.

An advantage of the present invention is that it provides a dual-port DRAM without a column decoder section associated with each sense amplifier row.

Other objects and advantages of the invention will become apparent in light of the following description thereof.

DETAILED DESCRIPTION OF THE EMBODIMENTS

Figure 1:
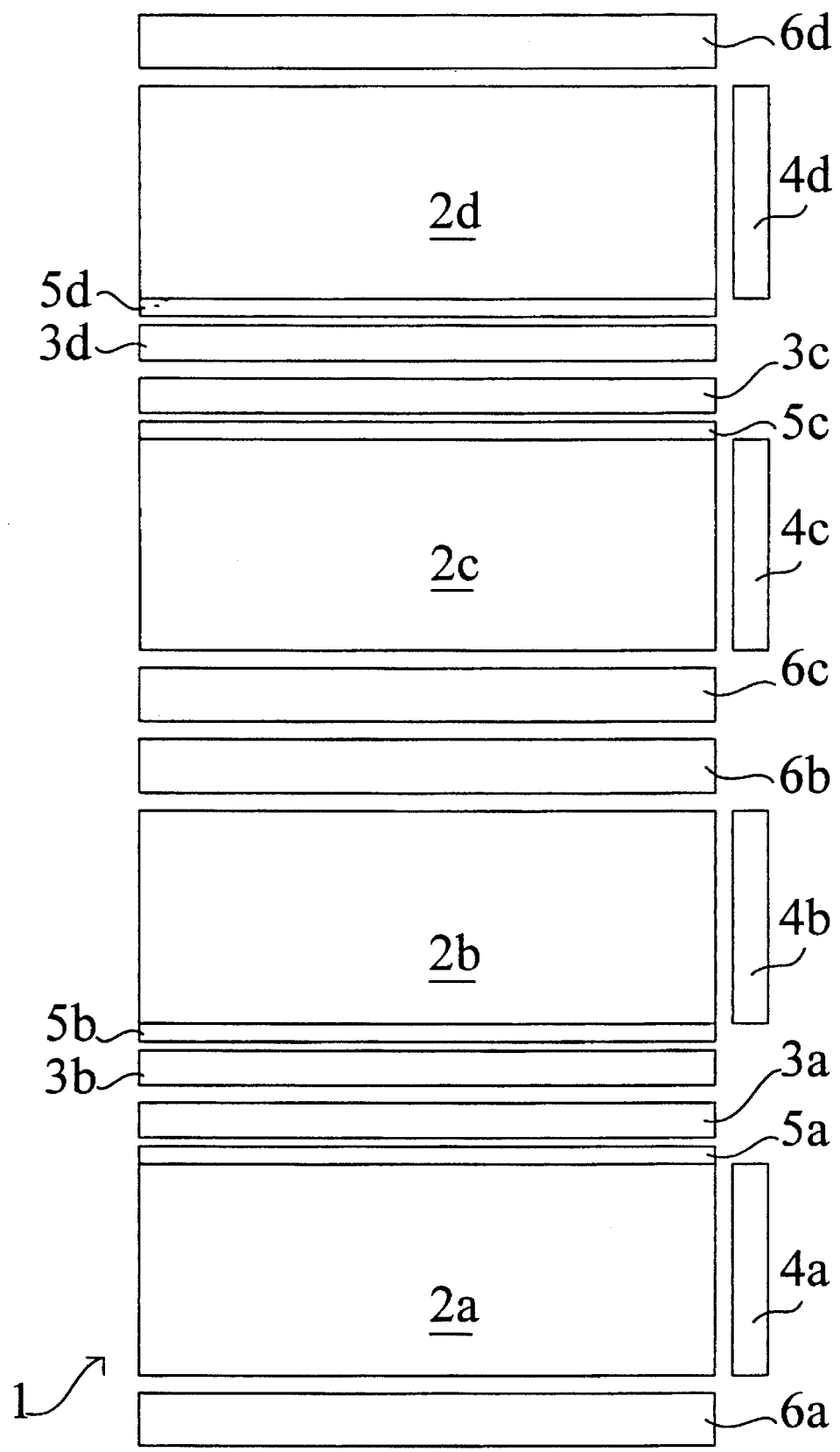
FIG. 1 is a block diagram illustrating a prior art dual-port DRAM configuration.
Figure 2:
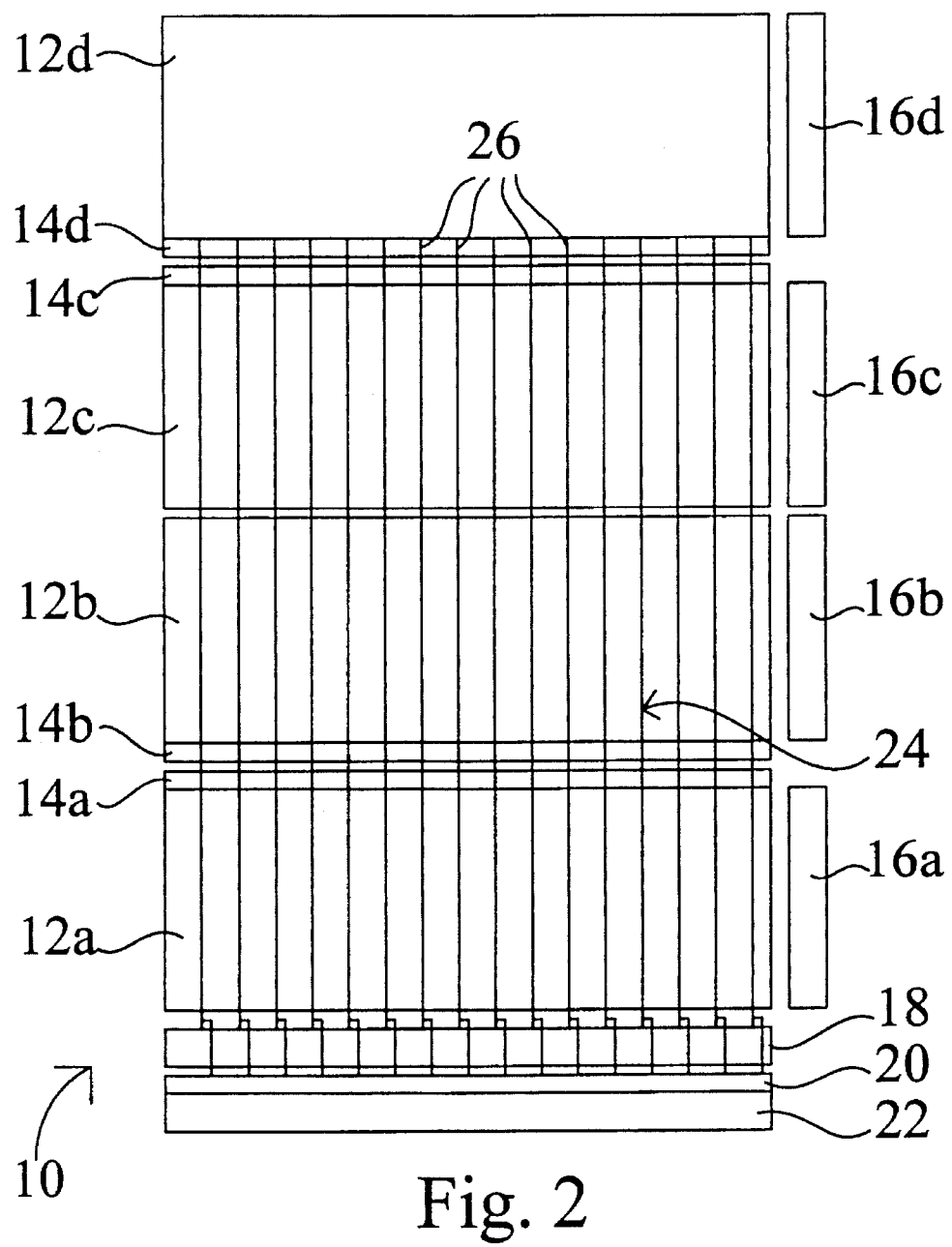
FIG. 2 is a block diagram illustrating a preferred embodiment of the present invention.

FIG. 2 illustrates, generally, a top view of the preferred embodiment of the present invention. The preferred embodiment is a dual-port DRAM and is designated by the general reference character 10. The preferred embodiment includes a number of array blocks 12. In the preferred embodiment four array blocks (12a–12d) are set forth. Each array block has the same configuration, being composed of a number of memory cells arranged in a number of columns and rows. In the preferred embodiment, each array block is 512 columns by 512 rows for a 1 megabit configuration. It is understood that the size and number of array blocks is intended to be illustrative only. One skilled in the art could arrive at designs employing fewer or greater array blocks with each array block having a larger or smaller storage capacity.

The preferred embodiment also includes a first through fourth sense amplifier row (14a–14b), with one sense amplifier row 14 being coupled to each array block 12. Each sense amplifier row 14 includes as many sense amplifiers as there are columns in its associated array block 12. Thus, for the example set forth in FIG. 2, each sense amplifier row 14 includes 512 sense amplifiers. In the preferred embodiment, the sense amplifier rows 14 for adjacent array blocks 12 are situated together, in the area between the array blocks 12. The first and second sense amplifier rows (14a and 14b) are situated between the first and second array blocks (12a and 12b). Likewise, the third and fourth sense amplifier rows (14c and 14d) are situated between the third and fourth array blocks (12c and 12d). Unlike prior art designs, there are no column decoders interposed between array blocks 12. This allows for a more compact design by decreasing the area consumed between adjacent array blocks 12. In the dual-port DRAM illustrated in FIG. 2 there is no intermediate circuitry between the second array block 12b and the third array block 12c. Further die area reduction could be obtained by the use of shared sense amplifiers.

Also shown in FIG. 2 are a first through fourth row decoding section (16a–16d). Each row decoding section 16 is coupled to an associated array block 12 for selecting a given row in the array block 12. As is well known in the art, the row decoders 16 decode a row address provided by an external controller (such as a microprocessor or graphics controller) to select a row. In the preferred embodiment the row address bits are received and latched in an address latch (not shown).

As is shown in FIG. 2, on one side of the first array block 12a, opposite from the first sense amplifier row 14a, are a column decoding section 18, a latch row 20, and a serial shift register 22. Disposed over array blocks 12a–12c is a global interconnect 24. In the preferred embodiment, the global interconnect 24 includes a number of global bit lines 26 extending from sense amplifier row 14d to the latch row 20. It is understood that the global bit lines 26 may also be routed over array 12d to maintain symmetry for each array 12a–12d. The global bit lines 26 are depicted as an arbitrary number of parallel lines in FIG. 2. The global bit lines 26 couple each sense amplifier row (14a–14d) to the latch row 20 and the column decoding section 18. As will be described in more detail herein, the global bit lines 26 are generally parallel to the local columns of the array blocks 12. It is understood that the global bit lines 26, for the most part, extend above the array blocks 12, extending vertically downward only to make contact with the sense amplifier rows 14, column decoding section 18 or latch row 20.

Figure 3:
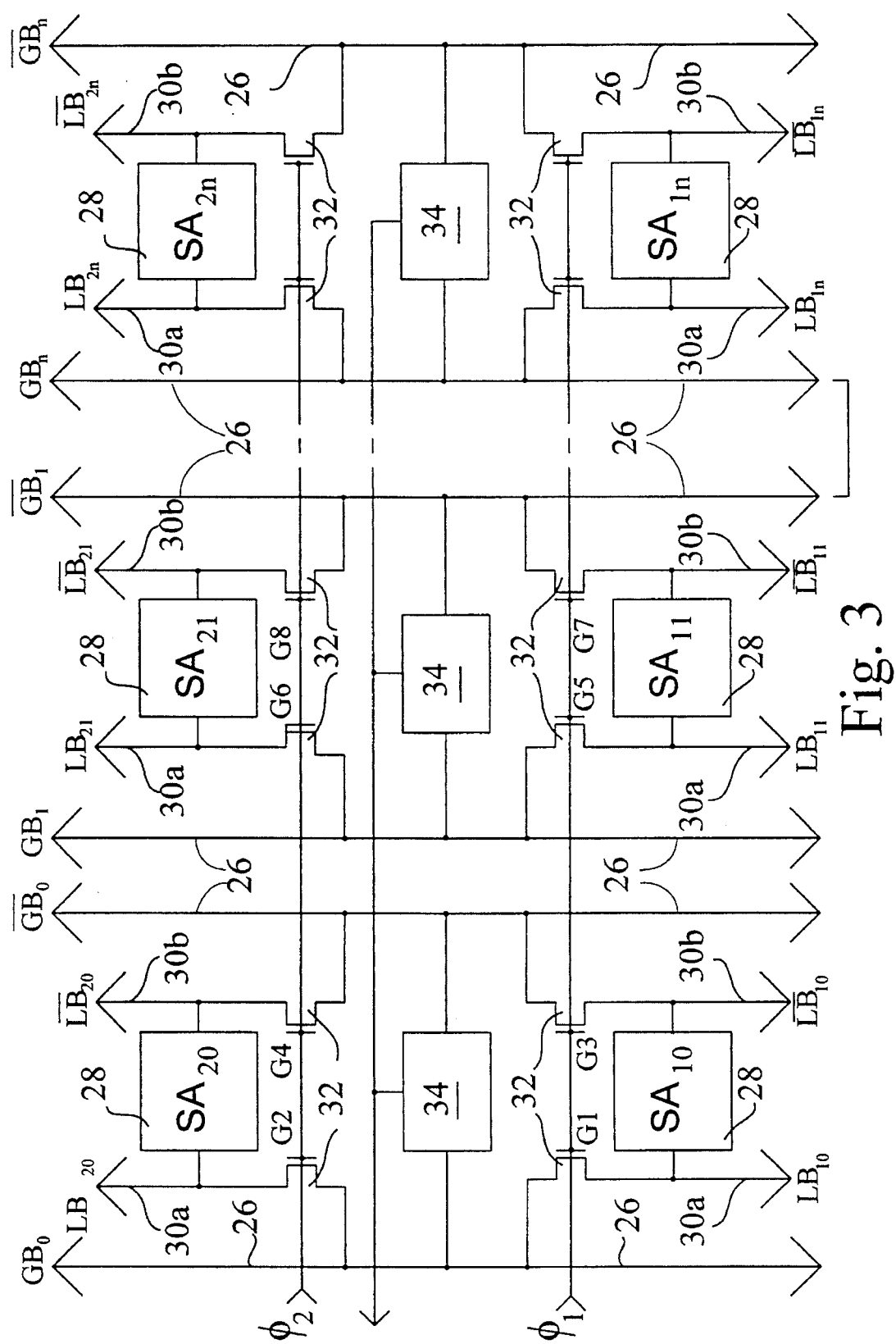
FIG. 3 is a block circuit diagram illustrating a connecting scheme between the local bit lines and the global bit lines in a preferred embodiment of the present invention.

Referring now to FIG. 3 a portion of the first array block 12a, second array block 12b, first sense amplifier row 14a, second sense amplifier row 14b, and global interconnect 24 are set forth in a schematic block diagram. FIG. 3 illustrates the connection scheme between sense amplifier rows 14 and the global bit lines 26 of the preferred embodiment. Three sense amplifiers 28 from the first sense amplifier row 14a and the second sense amplifier row 14b are shown. The sense amplifiers 28 of the opposing sense amplifier rows (14a and 14b) correspond to common local column numbers of their respective array blocks. For example, in FIG. 3, sense amplifiers 28 $SA_{10}$ and $SA_{20}$ both correspond to column zero, $SA_{11}$ and $SA_{21}$ correspond to column one, and the relationship is repeated for both sense amplifier rows 14 up to the last column "n" (n is equal to 512 in the preferred embodiment).

The array blocks 12 of the preferred embodiment are of a "folded" bit line design, that is, each column includes a local bit line pair 30 having a local bit line 30a and an local inverted bit line 30b. For the purposes of this description, a numbering convention is used wherein n is the column number, and m is the array block 12 number. The local bit line pairs 30 are shown as $LB_{mn}$ for local bit line and $\overline{LB}_{mn}$ for the local inverted bit line. The global bit lines 26 are shown as $GB_n$ and $\overline{GB}_n$. The global bit lines 26 are common to all array blocks 12 and so do not require an m designation.

Referring once again to FIG. 3 it is shown that the local bit line pairs 30 of each array block 12 are connected to a corresponding global bit line 26 by a pair of bit line gates 32. For each pair of bit line gates, one bit line gate connects an $LB_{mn}$ line to a corresponding $GB_n$ line and the other bit line gate connects an $LB_{mn}$ lines to a corresponding $GB_n$ line. In this manner, local bit line pairs 30 of different arrays 12 but identical columns are connected to the same global bit line 26. For example, in FIG. 3, for the first column (column 0) bit line gates 32 G1 and G2 connect local bit lines $LB_0$ and $LB_{20}$ to global bit line $GB_0$. In the same manner, bit line gates G3 and G4 connect $LB_{10}$ and $LB_{20}$ to $GB_0$. The same structure is repeated for the next column. Bit line gates G5 and G6 couple $LB_{11}$ and $LB_{21}$ to global bit line $GB_1$. Bit line gates G7 and G8 couple $LB_{11}$ and $LB_{21}$ to $GB_1$. This is repeated for all global bit line 26 and local bit lines 30 of like column numbers.

It is understood that while FIG. 3 sets forth a portion of the first and second sense amplifier rows, the third and fourth sense amplifier rows are connected to the same global bit lines in a like manner (i.e., in the preferred embodiment, local bit line pairs $LB_{10}/LB_{10}$, $LB_{20}/LB_{20}$ $LB_{30}/LB_{30}$ (not shown) and $LB_{40}/LB_{40}$ (not shown) are all connected to global bit line $GB_0$ by a pair of bit line gates 32.

To avoid any contention created by coupling one or more sense amplifiers 28 to the same global bit line 26 at the same time, the bit line gates 32 are activated by an array block decode signal $\phi_k$, where k is the number of the array block associated with the sense amplifier row. As shown in FIG. 3, bit line gates 32 G1, G3, G5, and G7 are activated by $\phi_1$, while bit line gates 32 G2, G4, G6 and G8 are activated by $\phi_2$. It is understood that in the preferred embodiment, each $\phi$ signal is commonly connected to turn on every bit line gate 32 within its respective sense amplifier row 14.

Referring once again to FIG. 3, coupled to each global bit line 26 is a global precharge circuit 34. The global precharge circuit 34 may pull the global bit lines to an intermediate voltage between the low and high logic levels in the device. This arrangement reduces the required voltage rise or drop (depending on the logic state) that must be provided by the sense amplifier 28 as it drives the global bit lines 26. It is understood that the global precharge circuit 34 may be situated anywhere along its associated global bit line 26. More than one global precharge circuit 34 may be employed per global bit line 26 as well.

Referring once again to FIG. 2, it is shown that while the preferred embodiment sets forth the column decoding section 18, latch row 20 and serial shift register 22 on one side of the first array block 21a, it is understood that all of the above device portions could be situated elsewhere. As just one example, the column decoding section, latch row, and serial shift register could be situated between the second and third array blocks (12b and 12c).

Figure 4:
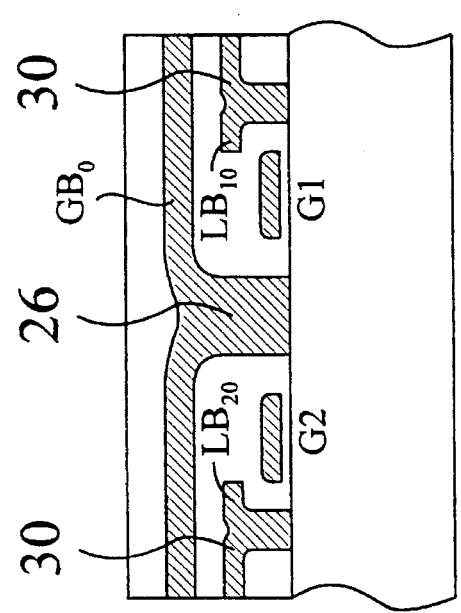
FIG. 4 is a side cross sectional view illustrating two gates connecting local bit lines of opposing arrays to a common global bit line.

Referring now to FIG. 4, it is shown that the global bit lines 26 are situated on a fabrication layer deposited subsequent to that of the local bit lines 30. In the preferred embodiment, the local bit lines 30 are fabricated as part of a first layer of metallization. The global bit lines 26 are fabricated as part of a second layer of metallization, situated above the local bit lines, separated by an interlayer dielectric. FIG. 4 is a cross sectional view illustrating local bit lines $LB_{10}$ and $LB_{20}$ coupled to global bit line $GB_0$ by bit line gates G1 and G2. It is understood that local and global bit lines may be realized by conductive materials other than metals, for example, doped polysilicon, and polysilicon/ silicide combinations.

Figure 5:
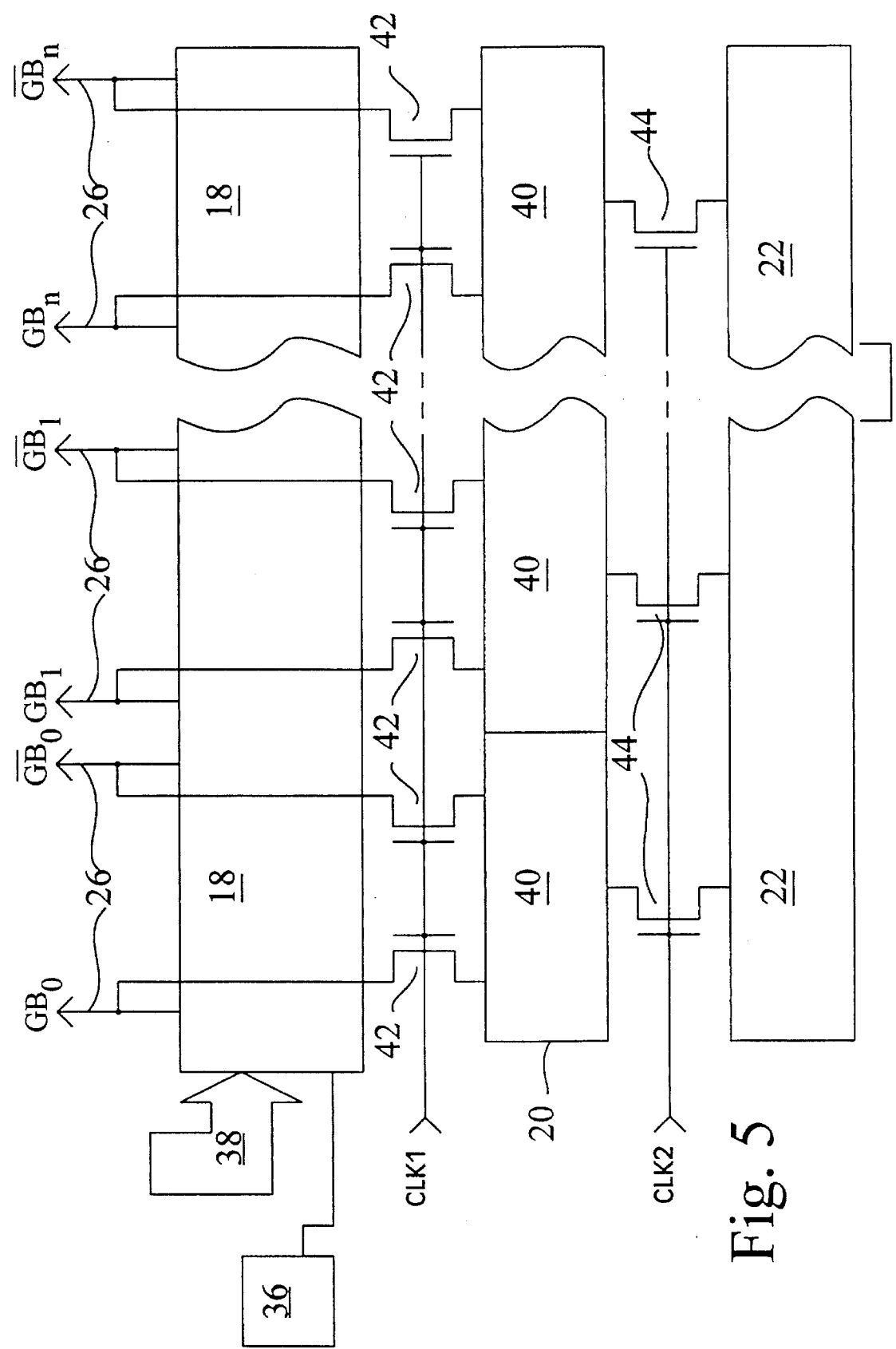
FIG. 5 is a block circuit diagram illustrating a portion of a preferred embodiment including the global bit lines, column decoding section, latch gates, latch row and serial shift register of a preferred embodiment.

Referring now to FIG. 5, a block diagram is set forth illustrating a portion of the column decoding section 18, latch row 20, and the serial register 22. The global bit lines 26 are coupled directly to the column decoding section 18, and to the latch row by a series of latch gates. In the preferred embodiment the column decoder includes a random input/output latch 36 and a column address input 38. The column decoder 18 in the preferred embodiment is a 512 into 1 decoder that connects one of the global bit line pairs 26, according to the column address, to the random input/ output latch 36.

As set forth in FIG. 5, the latch row 20 includes a number of latches 40 equal to the number of columns in each array block 12 (512 in the preferred embodiment). A pair of latch gates 42 connect each global bit line pair 26 to one latch 40 of the latch row 20. The latch gates 42 are commonly activated by a CLK1 signal which allows the latch gates 40. to operate in tandem to provide a parallel transfer data between the global columns 26 and the latch row 20. Similarly, a series of shift gates 44 connects each latch 40 of the latch row 20 to the serial shift register 22.

Having described the components of the preferred embodiment, the various modes of operation of the present invention will be described. Referring to FIGS. 3 and 5, in a random read mode the latch row 20 is decoupled from the global bit lines 26, and remains decoupled by signal CLK1 remaining low. The global bit lines 26 are then decoupled from their respective local bit lines 30 by the array decode signals ($\phi_1$–$\phi_4$) remaining low. The global bit lines 26 are precharged by their respective global precharge circuits 34 to an intermediate voltage. In the preferred embodiment, this intermediate voltage is the positive supply voltage less the threshold voltage of the sense amplifier transistors ($V_{cc}$– $V_T$). A row address is applied to the row decoders 16, which drive a selected row and a dummy row within one of the array blocks 12. The sense amplifiers 28 associated with the array block 12 sense the data stored in the selected row. Once the row data have been sensed, one of the array block decode signals ($\phi_1$–$\phi_4$) goes high, according to the row address in the preferred embodiment, connecting one of the four sense amplifier rows 14 to the global bit lines 26. A column address is applied to the column decode section 18 at the column address input 38. The column decode section 18 selects a pair of global bit lines 26 accordingly, and applies the data on the selected global column 26 to the random input/output latch 36.

The random write mode follows from the random read mode. The latch row 20 is decoupled from the global bit lines 26. The global bit lines 26 are decoupled from the local bit lines 30 and precharged. The row address signals are applied, selecting a row and dummy row. The array decode signal selects a particular array block 12, and couples the local bit lines 30 of the selected array block 12 to the global bit lines 26. A column address is received by the column decoding section and input data is received and stored in the random input/output latch 36. According to the column address, the column decoding section 18 applies the data stored in the random input/output latch 36 to the selected global bit line 26, and consequently, the corresponding sense amplifier 28, local bit line pair 30 and memory cell of the selected array block 12.

It is understood that data may read or written from the latch row 20 to the serial shift register 22 at any time during the random read or write operation.

For a serial read operation, the serial shift register 22 is first decoupled from the latch row 20, and the global bit lines 26 are precharged by their respective global precharge circuits 34. As in the random read operation, a row address is applied and the row decoders 16 drive a row and an accompanying dummy row. After the sense amplifiers 28 have is sensed the data, the local bit lines 30 of one array block 12 are coupled to the global bit lines 26 by the appropriate array block decode signal. Unlike the random read operation, signal CLK1 goes high, allowing the data of the selected row to be latched by the latch row 20. Once CLK1 goes low again, the data held by the latch row 20 can be read into the serial shift register by signal CLK2 going high as shown in FIG. 5.

One skilled in the art would recognize, that the serial shift register 22 can provide a single bit serial output, or a multi-bit serial output. In the preferred embodiment the serial shift register is configured to provide a "by four" (×4) serial output. This is accomplished by logically dividing the latched row data into 4 words. In the example of FIG. 5, each word would be 128 bits long. Thus, the first bits in a x4 output would be bit 0, bit 128, bit 256, and bit 384 of the 512 bits latched in the latch row 20. Of course, the serial shift register could be logically organized to provide other serial output configurations.

Figure 6:
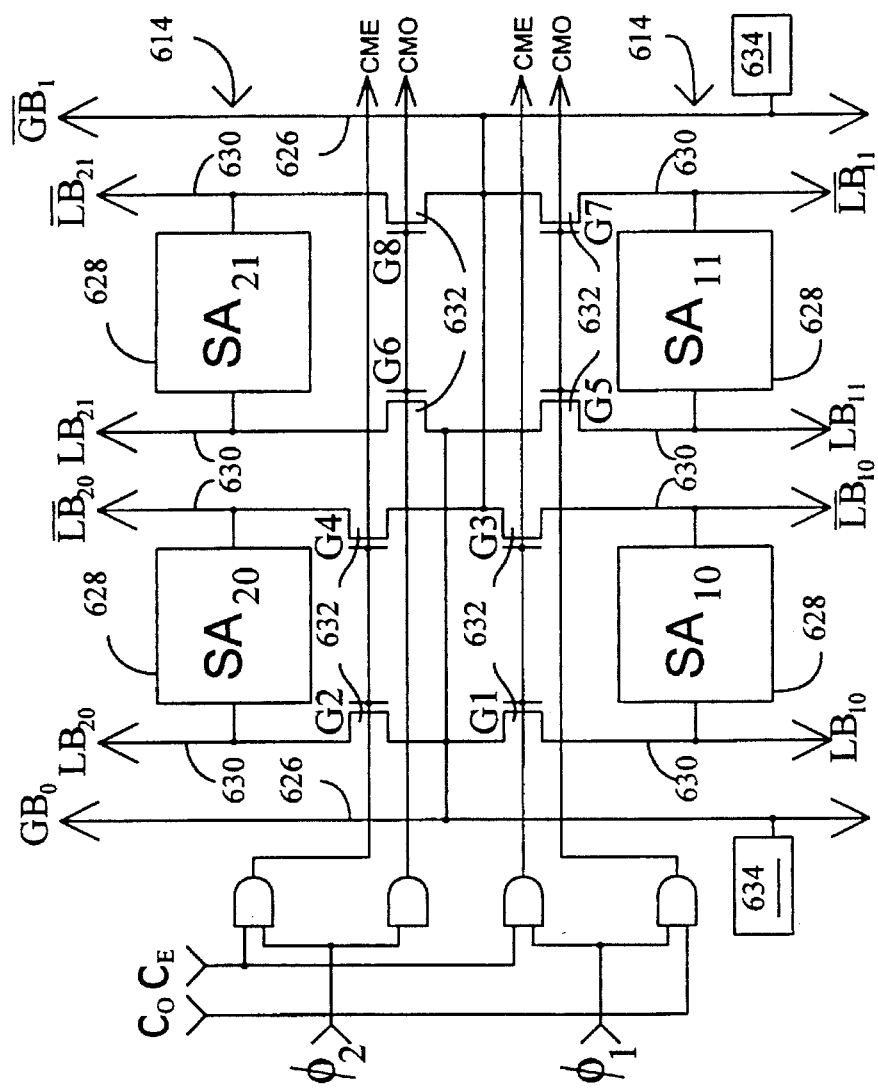
FIG. 6 is a block circuit diagram illustrating a connecting scheme between the local bit lines and the global bit lines in an alternate embodiment of the present invention.
Figure 7:
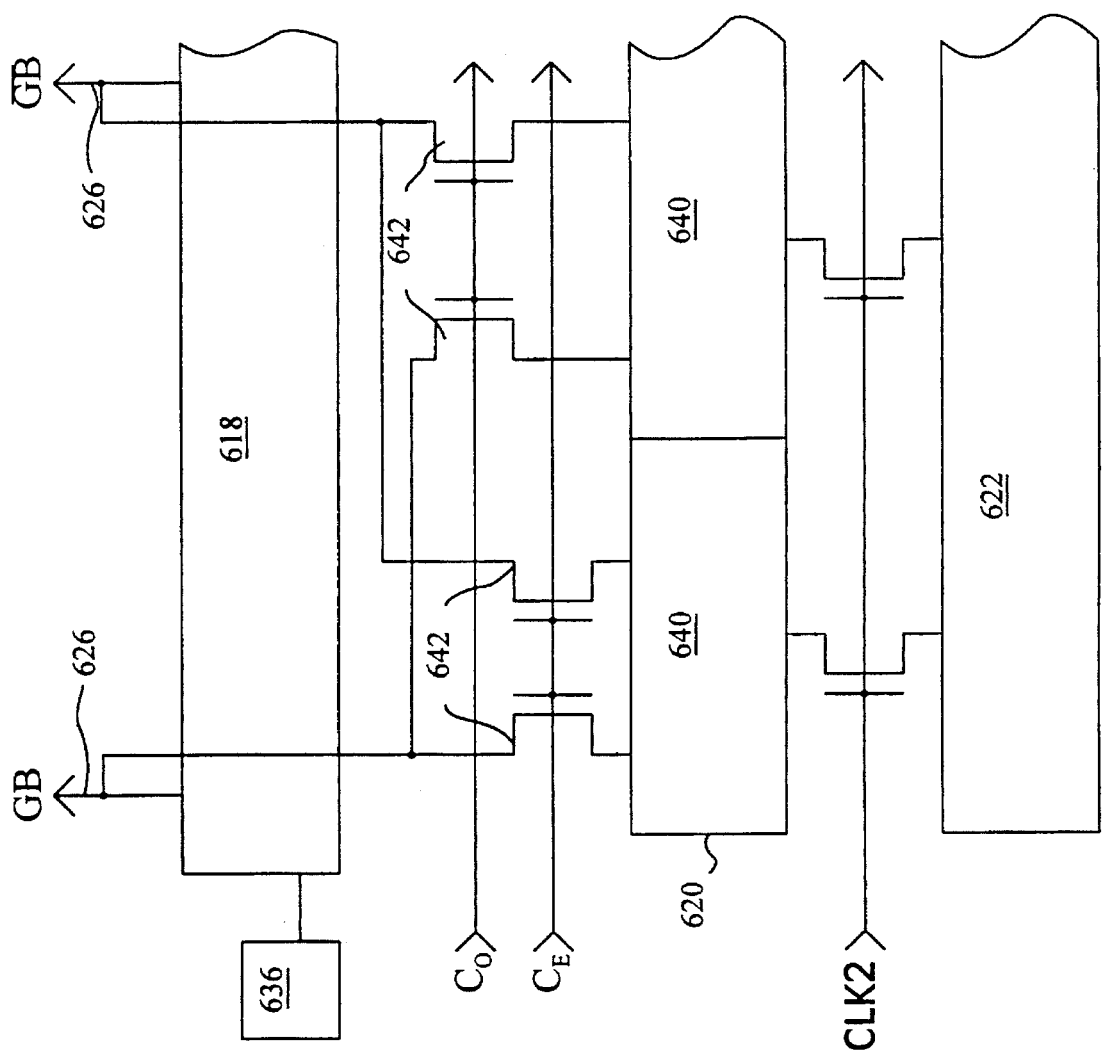
FIG. 7 is a circuit diagram illustrating a portion of an alternate embodiment including the global bit lines, column decoding section, latch gates, latch row and serial shift register of the preferred embodiment.

An alternate embodiment of the present invention is set forth in FIGS. 6 and 7. The alternate embodiment has the same general configuration of the preferred embodiment, and to that extent, identical items to those appearing in the preferred embodiment will be referred to by the same general reference character preceded by the digit "6".

Because of processing limitations and speed requirements of some applications, the minimum allowable pitch of the second layer of metallization will prohibit a one-to-one relationship between local bit line pairs 30 and global bit line pairs 26. The alternate embodiment addresses this limitation by presenting a gating structure that multiplexes two local bit line pairs 30 between one pair of global bit lines 26.

Referring now to FIG. 6, the first two sense amplifiers 628 of the first two sense amplifier rows 614 are set forth. The structure is similar to that of the preferred embodiment shown in FIG. 3, but differs in that there are only two global bit lines (as opposed to four) corresponding to the four local bit lines 630. The interconnection scheme between the four local bit lines and the two global bit lines includes bit line gates 632 G1–G8. The bit line gates 632 G1, G2, G5 and G6 all couple their respective local bit lines ($LB_{10}$, $LB_{20}$, $LB_{11}$ and $LB_{21}$) to global bit line $GB_0$. In the same manner, $LB_{10}$, $LB_{20}$, $LB_{11}$, $LB_{21}$, are coupled to global bit line $GB_0$ by bit line gates G3, G4, G7 and G8, respectively.

Unlike the preferred embodiment, the bit line gates 632 of the alternate embodiment are not activated by a common array block decode signal ($\phi_1$ and $\phi_2$). Data are multiplexed from the local bit lines 630 to the global bit lines 626 by first coupling odd local bit line 630 pairs to the global bit line pairs 626, followed by the even local bit line pairs 630. This is accomplished by applying an even column select signal CME to all even columns, and an odd column select signal to all odd columns. The CMO and CME signals, as shown in the figure, are the equivalent of an AND operation between the array block decode signal ($\phi_k$) and an odd column decode signal ($C_O$) or even column decode signal ($C_E$). It is understood that the arrangement illustrated in FIG. 6 is repeated for every two columns. One skilled in the art would recognize that for proper multiplexing $C_E$ operates a sufficient time after $C_O$ to allow the data placed on the global bit lines 626 to be properly latched by the output circuitry, or conversely, allow a proper write to occur to the selected memory cell. In the preferred embodiment, the time delay between $C_E$ and $C_O$ is also sufficient to allow the global bit lines 626 to be precharged by global precharge circuit 634.

Referring now to FIG. 7 a portion of the column decoding section 618, latch row 620 and serial register 622 of the alternate embodiment are illustrated. Because the $C_E$ and $C_O$ signals used to multiplex the local bit lines 630 function as an initial one-of-two decoder, the column decoding section 618 is a 1 of 256 decoder, requiring one less address input than that the preferred embodiment.

In addition to being coupled to the column decoder section 618, each global bit line 626 is coupled to two latches 640 of the latch row 620 by two pairs of latch gates 642. The latch gates 642 operate in a similar fashion to the bit line gates 632 to assure proper loading of data into the latch row 620. As shown in FIG. 7, the even numbered latches 640 are gated to the global bit lines 626 by the signal $C_E$, and the odd numbered latches 640 are gated by the signal $C_O$.

All read and write operations of the alternate embodiment are the similar to the preferred embodiment, but take into account the multiplexing scheme between local bit line pairs 630 and their associated global bit lines 626. A random read operation proceeds as in the preferred embodiment, but instead of an array decode signal selecting a particular sense amplifier row 614, the array decode signal is logically ANDed with the odd or even column select signals, according to the column address signal. Thus, all of the even or all of the odd numbered local bit lines 630 of a selected array block 612 are coupled to the global bit lines 626. The global bit lines 626 are decoded according the column address, and the selected bit written to or read from a random input/output latch 636 of the column decoding section 618.

Unlike the preferred embodiment, in the alternate embodiment the row access for the serial input or output function is a two step operation. In the first step, an array block 612 and row are selected according to the array block decode signal and the row address. $C_E$ is active, and all even column local bit lines pairs of the selected row and array block 612 are loaded by the selected sense amplifier row 614 into the global bit lines 626. The latch gates 642 operated by $C_E$ load the data from the global bit lines 626 into the even latches. In the second step, $C_E$ is inactive, $C_O$ is active, and the data on the odd columns local bit lines 630 in the selected row and array block are loaded onto the global bit lines 626. The $C_O$ signal at the latch gates 642 ensures that the data from the odd columns is coupled to the odd latches 640. Parallel loading between the latch row 620 and the serial shift register 622 occurs in the same manner as in the preferred embodiment.

It is understood that while the alternate embodiment sets forth 256 global bit line pairs 626 corresponding to the 512 local bit line pairs 630 within each array block 612, other embodiments having fewer numbers of global bit lines 630 may be arrived at by one skilled in the art. As just one example, an embodiment could employ 128 global bit line pairs, requiring a four-into-one multiplexing scheme for both the sense amplifier rows 614 and the latch row 620.

As will be apparent to one skilled in the art, the invention has been described in connection with its preferred embodiments, and may be changed, and other embodiments derived, without departing from the spirit and scope of the invention.

INDUSTRIAL APPLICABILITY

The predominant intended usage of the present invention is as a dual-port DRAM for video applications. The main area of improvement is a large reduction in the number of devices and area required to accomplish the dual-port memory design. One skilled in the art would recognize that the invention is also applicable to other memory types employing multiple column decoders, including SRAMs.

Since the dual-port DRAM of the present invention may be readily implemented with existing fabrication technologies, it is expected that it will be acceptable in the industry as a less costly and more compact alternative to existing dual-port memory designs. For these and other reasons, it is expected that the utility and industrial applicability of the invention will be both significant in scope and long-lasting in duration.

What we claim is:

1. A semiconductor memory device, comprising:

a plurality of array blocks, each array block including a plurality of memory cells disposed in rows and local columns;

row decoding means responsive to a row address for selecting one said row from said plurality of array blocks;

a sense amplifier row for each array block, each said sense amplifier row including a sense amplifier operatively coupled to one local column of the array block;

a random input/output latch;

a column decoder including a plurality of decoder input/outputs, said column decoder responsive to a column address for coupling a decoder input/output to said random input/output latch;

a row of latches, said row of latches including a latch for each local column in each array block;

a serial register operatively coupled to said row of latches for receiving data from said row of latches; and a layer of interconnect disposed above the array blocks, said layer of interconnect connecting one sense amplifier from each sense amplifier row to one latch of said row of latches, and to one decoder input/output of said column decoder.

2. The memory device of claim 1 including:

the number of the local columns in each said array block being N;

said layer of interconnect including N global columns; and row gate means operatively coupling one said sense amplifier row to the global columns.

3. The memory device of claim 2 wherein:

each array block is of folded bit line design and each local column includes a local bit line pair;

each said global column includes a global bit line pair; and said row gate means couples each local bit line pair of a selected array block to a global bit line pair.

4. The memory device of claim 1 including:

said layer of interconnect including a plurality of global columns; and means for precharging the global columns prior to reading data from and writing data into the array blocks.

5. The memory device of claim 1 including:

the number of local columns in each said array block being N, where N is an integer multiple of M;

said layer of interconnect including N/M global columns;

column multiplexing means for multiplexing the data from M local columns to one global column; and for each global column, latch multiplexing means for multiplexing each global column to one of M latches.

6. The memory device of claim 5 wherein:

M is equal to 2.

7. The memory device of claim 6 wherein:

the local columns include even local columns and odd local columns, one even local column and one odd local column being multiplexed to one global column;

said column multiplexing means includes an odd column gate operatively coupled between each odd local column and the odd local column's respective global column, and an even column gate operatively coupled between each even local column and the even local column's respective global column, the odd column gates being activated by an odd column decode signal, the even column gates being activated by an even column decode signal;

said row of latches includes N latches, including N/2 even latches, and N/2 odd latches; and said latch multiplexing means includes an odd latch gate and an even latch gate for each global column, each odd latch gate being coupled to one odd latch and each even latch gate being coupled to one even latch.

8. The memory device of claim 1 wherein:

each local column includes at least one bit line fabricated from a first layer of metallization; and said layer of interconnect includes a plurality of global bit lines fabricated from a second layer of metallization.

9. A semiconductor memory device fabricated in a single integrated circuit, comprising:

a plurality of array blocks, each array block including a plurality of memory cells arranged into rows and columns, each column including at least one local bit line;

sense amplifier means operatively coupled to each local bit line for sensing data on the local bit line;

global latch means for latching data;

a plurality of global bit lines;

decoding means for selecting a data path in response to an address, said decoding means being coupled to said plurality of global bit lines;

first gate means intermediate the local bit lines and said plurality of global bit lines for coupling the local bit lines of one said array block to the global bit lines;

second gate means intermediate said plurality of global bit lines and said global latch means for coupling the global bit lines to said global latch means;

serial shifting means for transmitting or receiving data in a serial manner; and third gate means for coupling said global latch means to said serial shifting means for transferring data therebetween.

10. The semiconductor memory device of claim 9 wherein:

said plurality of array blocks are disposed in a block column, the local bit lines of each array block being parallel to the block column;

said sense amplifier means includes a row of sense amplifiers associated with each array block, each row of sense amplifiers being perpendicular to the local bit lines and disposed intermediate the array blocks; and said first gate means includes a plurality of gates disposed intermediate the array blocks.

11. The semiconductor memory device of claim 10 wherein:

said plurality of global bit lines are disposed on a higher vertical layer than the local bit lines, the global bit lines being parallel to the local bit lines.

12. The semiconductor memory device of claim 10 wherein:

the block column includes a first end and a second end, each end being perpendicular to the local bit lines;

said global latch means, said decoding means, said second gate means, said serial shifting means, and said third gate means are disposed proximate the second end; and said plurality of global bit lines extending from said decoding means and said second gate means over at least one array block to said first gate means.

13. The semiconductor memory device of claim 10 wherein:

said global latch means, said decoding means, said second gate means, said serial shifting means, and said third gate means are centrally disposed within the block column.

14. The semiconductor memory device of claim 9 wherein:

each said block column of each array block includes a local bit line pair;

said plurality of global bit lines includes one global bit line pair for each local bit line pair in an array block; and said first gate means includes a transistor group for each array block, each transistor group including a pair of gate transistors for each local bit line pair, the gate transistors of each transistor group being commonly activated by a block decode signal such that only one transistor group is active at one time.

15. The semiconductor memory device of claim 9 wherein:

each array block includes column pairs, each column pair including an even column and an odd column, each even and odd column further including one of local bit line pairs;

said plurality of global bit lines includes one global bit line pair for every column pair;

said first gate means includes a transistor group for each array block, each transistor group including a pair of even line transistors and a pair of odd line transistors for each column pair, the pair of even line transistors connecting the local bit lines of the even column to one global bit line pair, the pair of odd line transistors connecting the local bit lines of the odd column to the same global bit line pair, the even line transistors being commonly activated by a block decode signal and an even column decode signal, the odd line transistors being commonly activated by a block decode signal and an odd column decode signal;

said global latch means includes a plurality of even latches and odd latches corresponding to one bit latch for every column in each array block; and said second gate means includes a pair of even latch transistors and a pair of odd latch transistors for each global bit line pair, each pair of even latch transistors connecting one of the global bit line pairs to an even latch, each pair of odd latch transistors connecting the same global bit line pair to an odd latch, the even bit line pairs being commonly activated by the even decode signal, the odd bit line pairs being commonly activated by the odd decode signal.

16. The semiconductor memory device of claim 9 wherein:

during a serial read operation data are serially received by the serial shifting means, transferred to said global latch means by said third gate means, transferred from said global latch means to the global bit lines by said second gate means, and transferred to a row by selecting the row, and coupling the global bit lines to the sense amplifiers means of the array block that includes the selected row.

* * * * *